| United States Patent [19] | [11] 3,944,919 |
|---|---|
| Jewell et al. | [45] Mar. 16, 1976 |

[54] DIRECT CURRENT MEASURING SYSTEM FOR RECTIFIERS

[75] Inventors: James G. Jewell, Bryn Mawr; Fred W. Kelley, Jr., Media; Charles H. Titus, Newton Square, all of Pa.

[73] Assignee: General Electric Co., Philadelphia, Pa.

[22] Filed: Sept. 26, 1974

[21] Appl. No.: 509,509

[52] U.S. Cl. ................. 324/107; 324/119; 324/127
[51] Int. Cl.² ................. G01R 19/00; G01R 19/18
[58] Field of Search ................. 324/107, 119, 127; 323/120; 321/57

[56] References Cited
UNITED STATES PATENTS

| 2,588,155 | 3/1952 | Ofverholm et al. | 324/119 |
| 2,934,691 | 4/1960 | Logsdon | 321/57 |
| 3,281,642 | 10/1966 | Dortort | 324/107 |

*Primary Examiner*—R. V. Rolinec
*Assistant Examiner*—Ernest F. Karlsen
*Attorney, Agent, or Firm*—J. Wesley Haubner

[57] ABSTRACT

A DC measuring circuit for power rectifiers is described wherein primary line current is utilized to measure direct current output. In the measuring circuit line current transformers are connected to a multiphase instrument rectifier through a phase shifting current transformer which is adjustable to compensate for difference between the primary to secondary line current phase shift characteristic of the power transformer and any phase shift in the line current transformers. By such compensation the average value of rectified primary line current in the measuring circuit is maintained independent of the commutating angle of the rectified power current.

13 Claims, 10 Drawing Figures

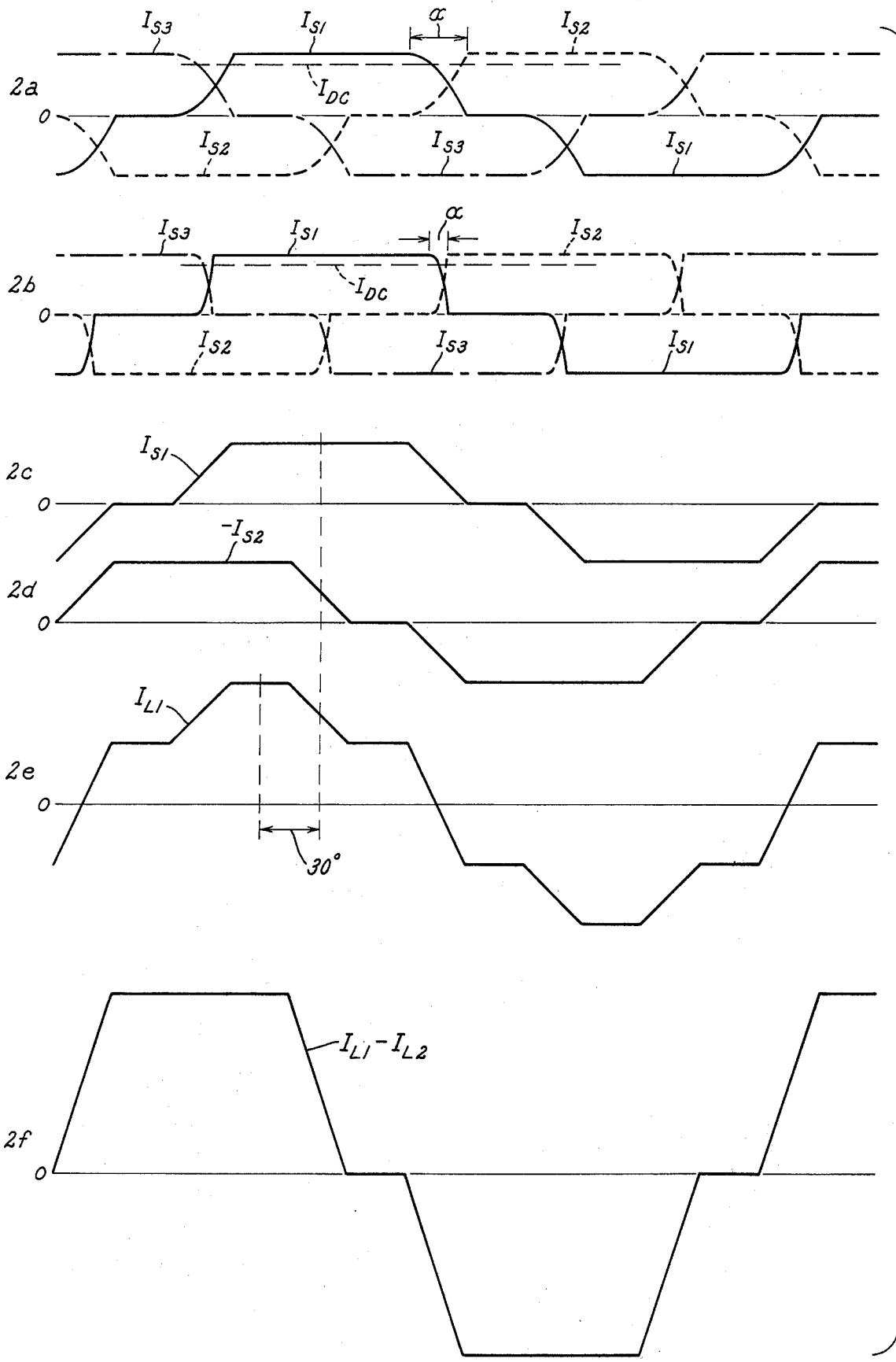

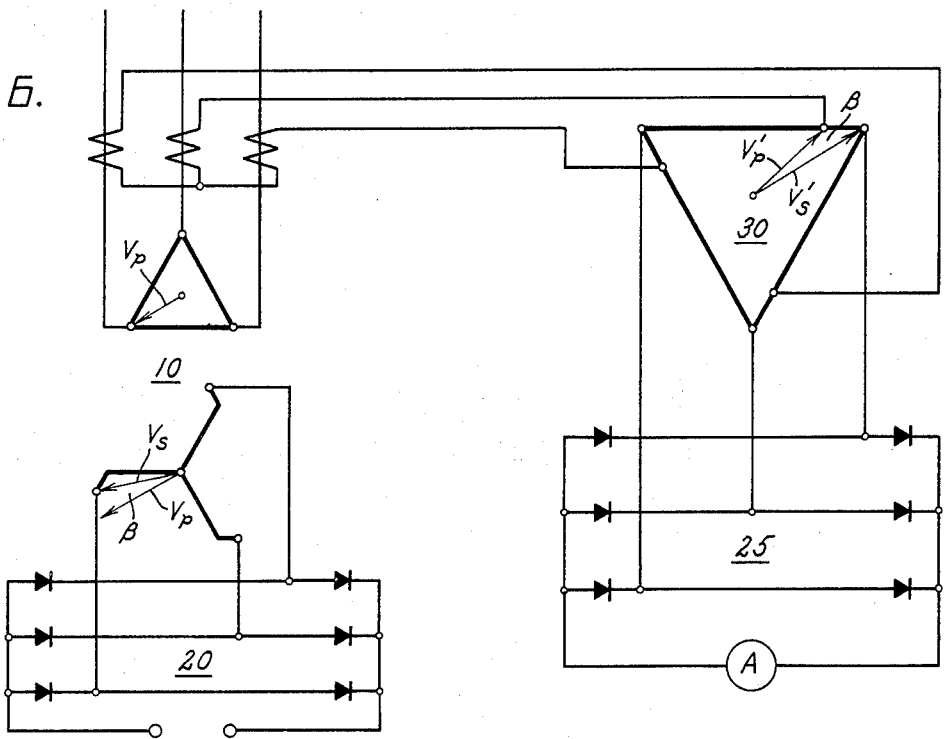
Fig. 6.
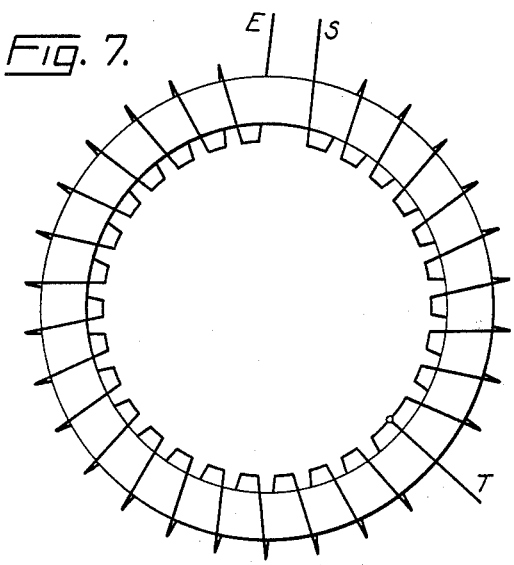
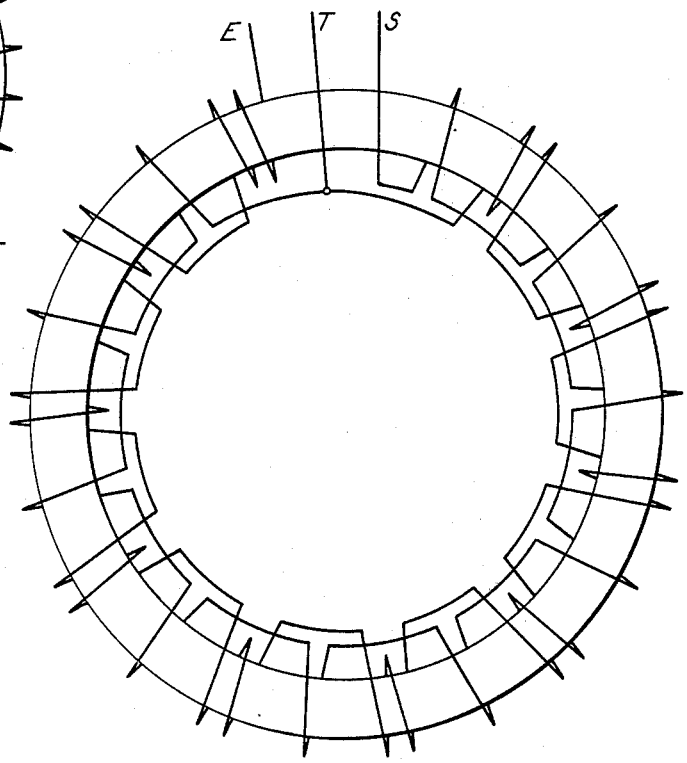
Fig. 7.
Fig. 8.

DIRECT CURRENT MEASURING SYSTEM FOR RECTIFIERS

Our invention relates to the measurement of unidirectional current, and particularly to measurement of the unidirectional output current of multiphase power rectifiers. The invention is especially useful in the measurement of rectifier output currents having a magnitude of the order of a thousand amperes or more. U.S. Pat. No. 3,281,642-Dortort is representative of the most relevant prior art known to applicants.

As noted in the Dortort patent, many prior circuits for measuring unidirectional current are known. At very high currents of the order of several thousand to over 100,000 amperes, a simple shunt in the DC line is subject to inaccuracies. More complex arrangements known are DC transductors and Hall generators, but these are expensive and difficult to maintain in proper calibration. Dortort utilizes still another arrangement in which the direct output current of a multiphase rectifier is measured by measuring the proportional alternating current on the input side of the rectifier. Dortort discloses that AC meters have previously been so used, but that these become inaccurate as the commutation or overlap angle changes. To overcome this defect Dortort rectifies the multiphase currents from primary line current transformers and uses a DC measuring instrument, pointing out that changes in overlap angle do not change the average value of the rectified instrument current unless the power transformer winding connection is one which produces a phase shift between primary and secondary line currents. If the rectifier power transformer is connected in wye-wye or delta-delta so that no phase shift occurs between primary and secondary line currents, current transformers on the primary side may be wye connected through a multiphase instrument rectifier to a DC measuring instrument to give accurate results. However, where the power transformer is connected in wye-delta or delta-wye so that phase shift between the primary and secondary line currents does occur, wye connected current transformers introduce an inaccuracy. Dortort discloses that in such a case inaccuracy is eliminated by delta connection of the current transformer secondaries associated with the primary line conductors and connection of these secondaries to a DC measuring instrument through a multiphase instrument rectifier.

The instrument rectifier and delta connected current transformers of the Dortort patent eliminate error due to a 30° power circuit phase shift, as in a simple wye-delta or delta-wye three phase power circuit connection, but do not eliminate phase shift error in power circuits wherein the primary to secondary phase shift is other than 30°. Zig-zag transformer connections and the more complex 6-phase, 12-phase, 24-phase or 36-phase circuits used in very high current power rectifiers present such problems. It is desirable therefore to provide a direct current measuring circuit utilizing current transformer apparatus on the primary side of the power transformer which is adjustable to compensate for power transformer phase shift of various degrees.

Accordingly, it is a general object of our invention to provide an improved, low cost DC measuring system for power rectifier apparatus.

It is a more particular object of our invention to provide improved means for utilizing alternating input circuit current to measure DC output current in power rectifier apparatus without introducing error due to power transformer phase shift.

Still another and more specific object of our invention is to provide, in such a system for measuring DC output current of a power rectifier from the primary side of the power transformer, means for eliminating error due to power transformer phase shift which is adjustable to accommodate the phase shift characteristics of various power transformer connections.

In carrying out our invention in one preferred embodiment applicable to power rectifier systems having a three phase primary winding and any desired power transformer secondary winding connection we utilize line current transformers in the primary, or input, circuit of the power transformer with the current transformer secondary windings connected in wye circuit relation to a three phase instrument rectifier through a phase shifting current transformer. The phase shifting current transformer is preferably an autotransformer and may be wye-connected or delta connected with its output or secondary terminals connected to the instrument rectifier. In a delta connected autotransformer the primary or input winding in each phase comprises less than a complete output phase winding and includes an intermediate winding tap. The primary winding taps are symmetrically positioned on the autotransformer windings and connected to the line current transformers. By appropriate selection of the tap point locations the autotransformer current phase shift in the instrument circuit may be controlled to compensate accurately for power circuit phase shift of various characteristic magnitudes, as determined by the power transformer winding connections.

Our invention will be more fully understood and its various objects and advantages further appreciated by referring now to the following specification taken in conjunction with the accompanying drawing in which:

FIG. 2 is a family of current wave shapes characteristic of the circuit of FIG. 1;

FIG. 6 is a schematic circuit diagram of a power rectifier and direct current measuring system embodying our invention and illustrating its application to systems wherein the power transformer has a characteristic primary to secondary line current phase shift other than 30°;

FIGS. 7 and 8 illustrate current autotransformer winding arrangements suitable for use with our invention.

Figure 1:
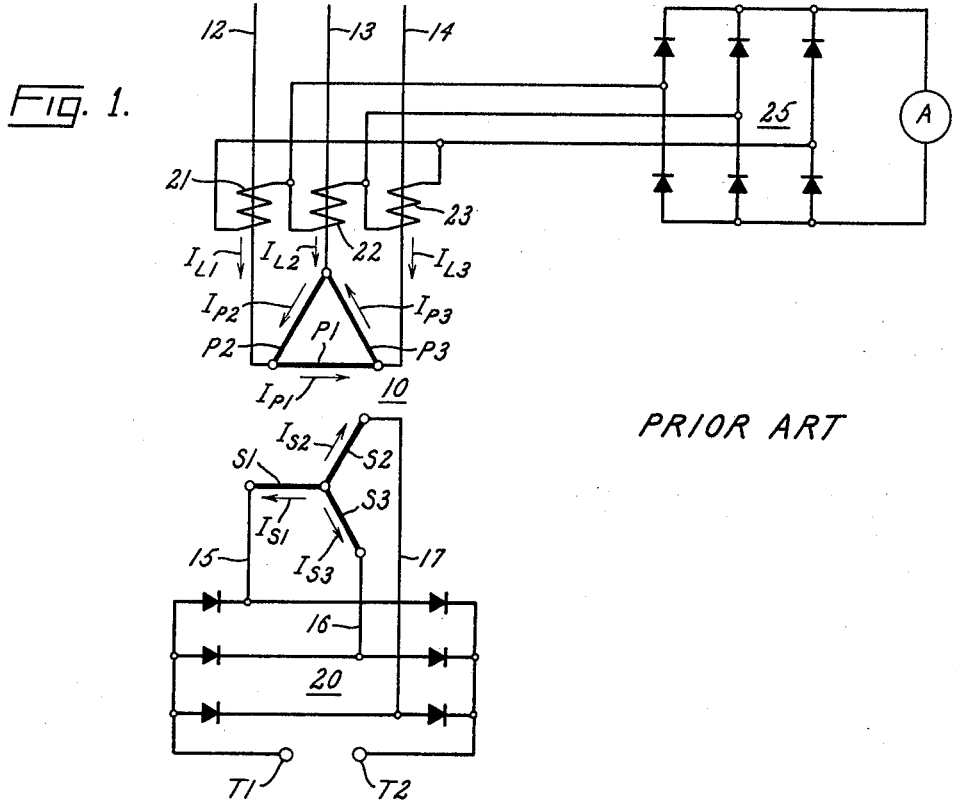
FIG. 1 is a schematic circuit diagram of power rectifier apparatus including a direct current measuring circuit known to the prior art.

At FIG. 1 we have illustrated a power rectifier circuit and direct current measuring circuit the same as that shown in the above identified Dortort patent. In this circuit a rectifier power transformer 10 includes three primary phase windings P1, P2, and P3 connected in delta circuit relation to a three phase source of electric current supply through line conductors 12, 13, 14. The power transformer 10 also includes secondary phase windings S1, S2, and S3 connected in wye circuit relation and through secondary line conductors 15, 16, 17 to a three phase bridge type power rectifier 20 having direct current output terminals T1, T2.

The direct current measuring circuit illustrated at FIG. 1 determines the magnitude of unidirectional current through a load connected to the terminals T1, T2 by measurement of primary line current to the power transformer. For this purpose three line current transformers 21, 22, 23 are associated with the three phase line conductors 12, 13, 14, respectively, on the primary or input side of the power transformer 10. The secondary windings of the line current transformer 21, 22, 23 are connected in delta circuit relation and the terminals of the delta are connected through a three phase bridge type instrument rectifier 25 to a DC measuring instrument or ammeter A.

At FIG. 1 we have designated the currents in the primary phase windings of the power transformer 10 as $I_{p1}$, $I_{p2}$, and $I_{p3}$, and have designated the currents in the associated secondary phase windings, respectively, as $I_{s1}$, $I_{s2}$, and $I_{s3}$. Because the power transformer secondary windings are wye-connected the secondary line currents, or power transformer output currents, are the same as the secondary phase winding currents. Characteristic wave shapes and the phase relationship of the secondary line currents $I_{s1}$, $I_{s2}$ and $I_{s3}$ are shown at FIG. 2a. FIG. 2a illustrates that the rectified positive half cycles of secondary line current in the several phases overlap during commutation throughout commutating, or overlap, angles $\alpha$. The average value of this rectified unidirectional current is shown at FIG. 2a as a dotted line $I_{dc}$. It is known that the average value of this direct current remains constant even though the commutating angle of overlap $\alpha$ changes. This is illustrated at FIG. 2b where the magnitudes and wave shapes of the secondary line currents are substantially the same as at FIG. 2a except that the angle of overlap is less.

It will be apparent to those skilled in the art that if the primary power transformer windings at FIG. 1 were wye connected, (i.e., a wye-wye connection) the primary line currents would be in inverse phase relation to the corresponding secondary line currents and would have the same wave shape and relative phase relation as illustrated at FIG. 2a. In that case measurement of the average value of rectified primary line current, as through wye connected primary current transformers and the instrument rectifier 25, would accurately measure the direct output current at the terminals T1, T2. It will be evident to those skilled in the art that this same inverse phase relationship between primary and secondary line currents would also exist if the primary and secondary power transformer windings were both connected in delta phase relationship (i.e., a delta-delta connection), and in this case measurement of rectified primary line currents would also be an accurate measure of the rectified secondary line currents.

In the power rectifier circuit actually illustrated at FIG. 1, however, where the power transformer is connected in delta-wye relationship, a phase shift occurs between primary line current and secondary line current in the same phase, and in the case of the three phase power transformer illustrated at FIG. 1 this phase shift is 30°. In such a case when the angle of overlap changes the average value of rectified primary line current is no longer an accurate measure of the average value of rectified secondary line current. Dortort has shown in his foregoing patent that this effect may be counteracted by delta connection of the line current transformers on the primary side of the power transformer, as illustrated at FIG. 1. The reason for such power transformer phase shift and the effect of the Dortort circuit is illustrated at FIGS. 2c, 2d, 2e and 2f.

Referring now to FIGS. 2c, 2d, 2e and 2f, FIG. 2c illustrates the same secondary line current $I_{s1}$ shown at FIG. 2a but with the commutating portions at opposite ends of each half cycle simplified by straight line illustration. In similar manner FIG. 2d shows the reverse of line current $I_{s2}$ and is designated $-I_{s2}$. As will be evident to those skilled in the art the current in primary line conductor 12, designated as $I_{L1}$, is equal to $I_{s1} - I_{s2}$ and is thus the sum of current curves illustrated at FIGS. 2c and 2d. This line current is illustrated at FIG. 2e. It will be observed that the fundamental of the line current $I_{L1}$ is advanced by 30 electrical degrees with respect to the secondary line current $I_{s1}$.

It will now be evident that the line currents $I_{L2}$ and $I_{L3}$ at FIG. 1 also have shapes similar to the current illustrated at FIG. 2e and that these line currents are displaced from each other by 120° in the usual three phase relation. Currents of similar shape therefore appear in the secondary windings of the current transformers 21, 22 and 23. These transformers, being delta connected, provide at each delta terminal an input current to the instrument rectifier 25 which has a shape determined by the difference of two such line currents. Such a current wave shape is illustrated at FIG. 2f. The average value of three rectified currents of this shape, as appears in the output of the instrument rectifier 25, is independent of variations in the angle of overlap of phase currents in the power circuit.

Figure 3:
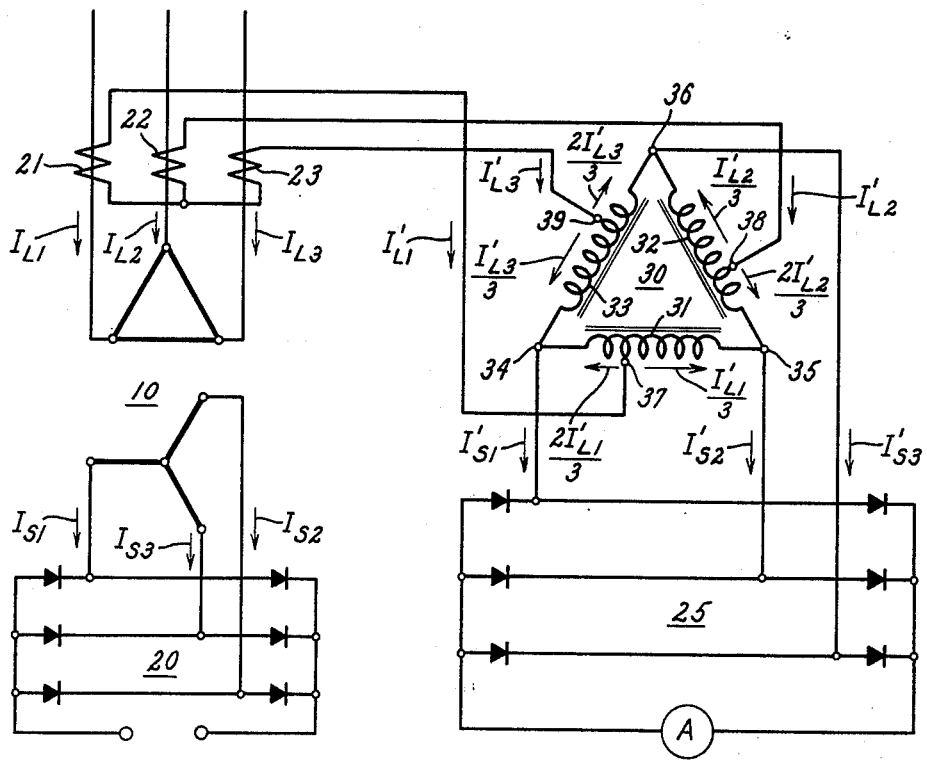
FIG. 3 is a schematic circuit diagram of power rectifier apparatus having a power circuit the same as that at FIG. 1 but including a direct current measuring circuit embodying our invention.

While the delta connected current transformers disclosed in the Dortort patent produce the effect described immediately above for a 30° phase shift between primary and secondary line currents in the power circuit, it is not adjustable to similarly eliminate error in the case of power transformer connections which produce primary to secondary phase shifts other than 30°. Our improved DC measuring circuit illustrated at FIG. 3 is adjustable to compensate for the effect of power transformer phase shift whether it be 30° or other than 30°. The power transformer connection shown at FIG. 3 is the same as that shown at FIG. 1 so that in the case there illustrated the power transformer phase shift is in fact 30° as at FIG. 1. The manner in which this phase shift effect is compensated, however, is different and provides adjustable means by which it may be adapted to power transformer connections characterized by phase shift of different magnitude.

In FIG. 3 the power transformer circuit is similar to that of FIG. 1 and like parts have been assigned the same reference numerals. In the measuring circuit at FIG. 3, however, the primary line current transformers 21, 22, and 23 are wye connected and their phase terminals are connected to the instrument rectifier 25 through a phase shifting current transformer shown as delta connected autotransformer 30. The current autotransformer 30 comprises three inductive phase windings 31, 32, 33 connected in delta circuit relation and each wound upon a separate iron core. The autotransformer 30 provides secondary or output terminals 34, 35, 36 at the delta terminals of the phase windings and intermediate tap terminals 37, 38, 39 which define primary or input winding portions. The windings 31, 32 and 33 and their respective magnetizable cores are so designed that the cores do not saturate under the maximum current conditions for which the apparatus is designed.

As illustrated at FIG. 3, each phase terminal of the wye connected current transformers 21, 22, 23 is connected to one intermediate tap terminal between the ends of one of the delta connected autotransformer windings 31, 32, 33. The tap points on the autotransformer phase windings are symmetrically positioned in the sense that the turns ratio of winding sections on opposite sides of each tap is the same for all windings and each delta or output terminal of the autotransformer is common to unlike ends of adjacent phase windings. In the case of a 30° power transformer phase shift characteristic, as in the circuit at FIG. 3, these intermediate taps are located on each autotransformer winding that winding sections on opposite sides of the tap commonly having a 2:1 turns ratio.

It will now be understood that each transformed line current $I'_{L1}$, $I'_{L2}$, $I'_{L3}$ flowing into a primary tap point of the current autotransformer 30 divides between winding sections on opposite sides of that tap in inverse proportion to the turn ratio of the winding sections and flows in opposite directions toward the adjacent delta winding secondary or output terminals. This 2:1 division of current in each winding 31, 32, 33 is indicated on the drawing at FIG. 3. Such current relationship in each autotransformer winding is maintained by the inductive coupling between the winding sections on opposite sides of the winding tap so long as the associated core remains in an unsaturated condition. By this inductive coupling the input current is forced to so divide that, neglecting magnetizing current, the ampereturns in the phase winding portions on opposite sides of each tap are maintained equal.

At FIG. 3 we have designated the phase currents entering the instrument rectifier bridge 25 from the output terminals of the current autotransformer 30 as $I'_{s1}$, $I'_{s2}$, $I'_{s3}$. It will be evident to those skilled in the art that in each case such phase current is the sum of the autotransformer winding currents entering the associated output terminal. For example, $$I'_{s1} = \frac{I'_{L3}}{3} + \frac{2I'_{L1}}{3}.$$

Figure 4:
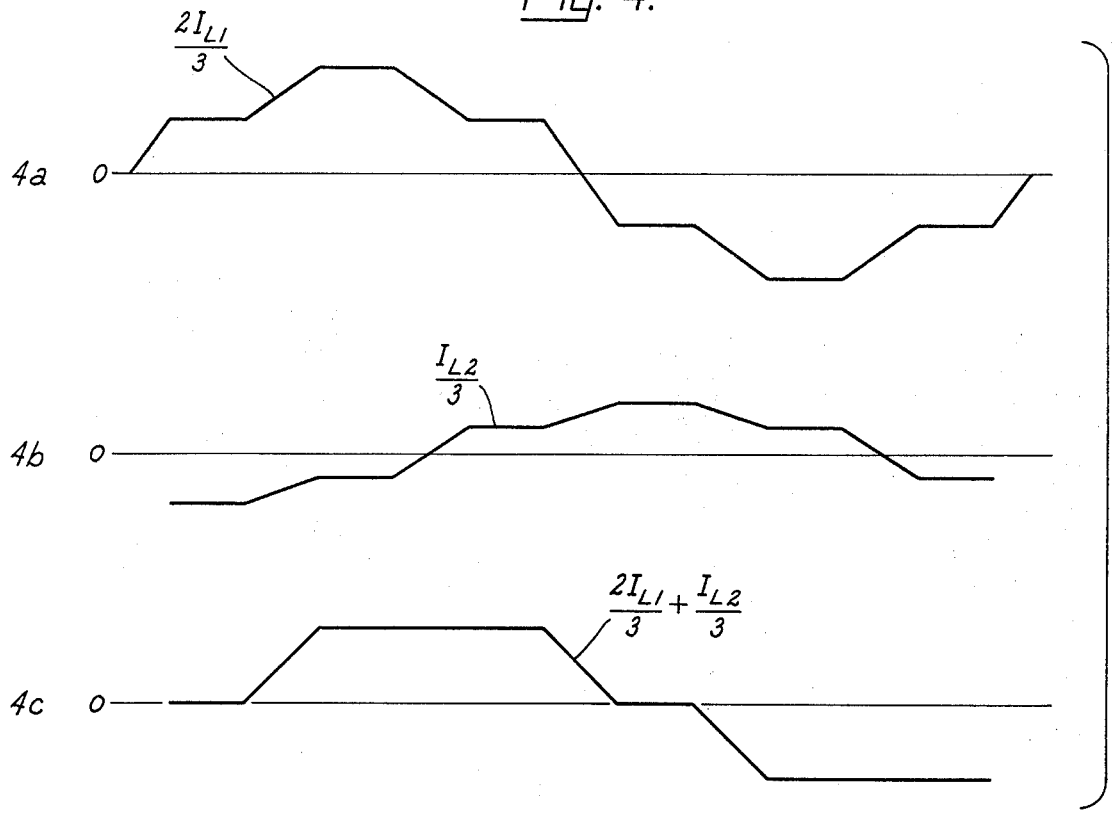
FIG. 4 is a family of current wave shapes characteristic of the measuring circuit of FIG. 4.

The instrument phase current $I'_{L1}$, $I'_{L2}$, $I'_{L3}$ are in 120° phase relation and each has the same shape as the associated line current $I_{L1}$, $I_{L2}$, $I_{L3}$ (see FIG. 2e). The summation of these autotransformer winding currents for one output terminal of the autotransformer 30 is shown at FIG. 4.

At FIG. 4a we have illustrated a current wave shape representing $2I'_{L1}/3$; at FIG. 4b we have illustrated a current wave shape representing $I'_{L2}/3$; FIG. 4c represents the current wave shape resulting from the addition of these autotransformer winding currents. Thus it will be evident that each of the output currents $I'_{s1}$, $I'_{s2}$ and $I'_{s3}$ from the terminals of the current autotransformer 30 has the wave shape of FIG. 4c and that these output currents are in 120° phase relation. In the circuit of FIG. 3 therefore the three phase currents entering the instrument rectifier 25 each have the same wave shape as the currents $I_{s1}$, $I_{s2}$ and $I_{s3}$ in the secondary line conductors of the power circuit, so that the average value of rectified output current from the power rectifier 20 is accurately reflected in the average value of the rectified output current from the instrument rectifier 25, and both are independent of overlap angle.

Figure 5:
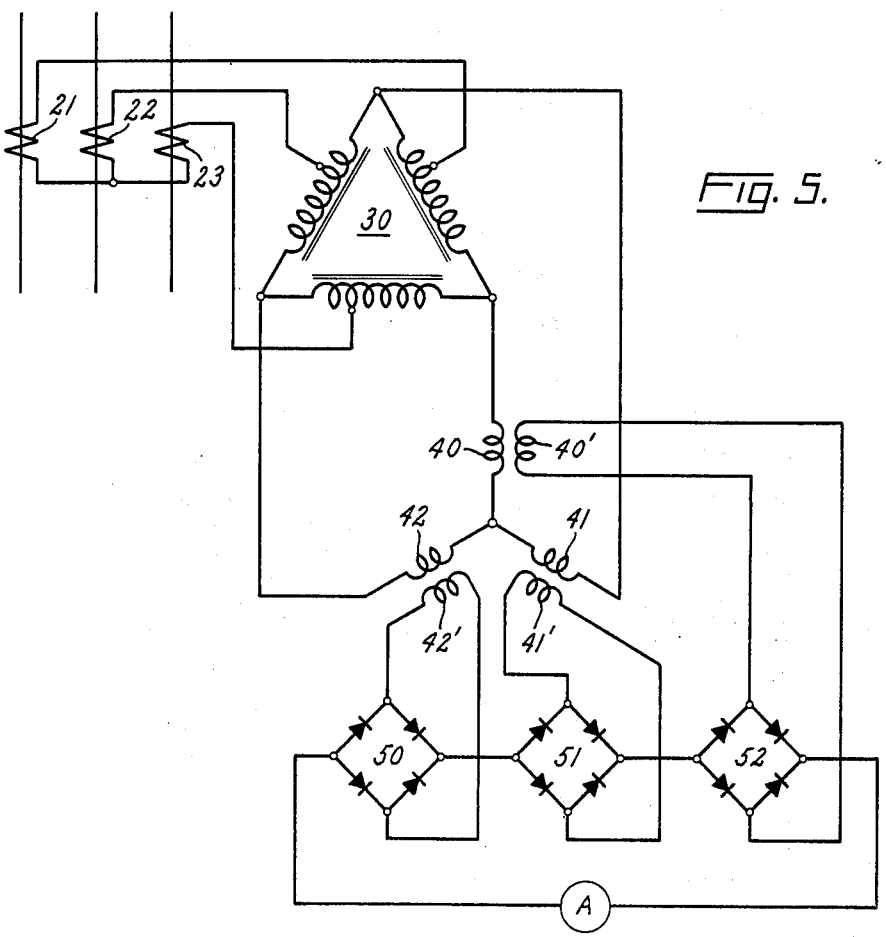
FIG. 5 is a schematic circuit diagram of a direct current measuring circuit applicable to the power rectifier circuit of FIG. 3 and illustrating another embodiment of our invention.

At FIG. 5 we have illustrated anothr modification of measuring circuit embodying our invention and applicable to the power rectifier circuit shown at FIG. 3. In FIG. 5 the current autotransformer 30 is connected to the line current transformers 21, 22, 23 of FIG. 3 in the same manner as the current transformer 30 shown at FIG. 3. At FIG. 5 however the output circuit of the autocurrent transformer 30 comprises three wye connected primary windings 40, 41, 42 of an instrument current transformer having secondary windings 40', 41', 42'. The instrument current transformer secondary windings are separately connected to the input terminals of three full wave, single phase instrument rectifier bridges 50, 51, 52 the output circuits of which are connected in series circuit relation to the ammeter A.

In our improved DC measuring circuit for power rectifiers the current autotransformer 30, if provided with selectable primary taps on each phase winding, may be adjusted to compensate for any characteristic degree of phase shift in the power transformer. At FIG. 6 we have shown a simplified schematic circuit diagram similar to that of FIG. 3 but in which each phase of the power transformer secondary winding comprises zigzag connected winding sections so combined that the secondary line currents in the power circuit are displaced in phase with respect to the primary phase winding currents. In the circuit of FIG. 6 therefore the phase shift in fundamental frequency between primary and secondary line currents in the power circuit is other than 30°. In this general case proper compensation is obtained by so selecting each tap point on the current autotransformer 30 that the angle $\beta$ and the direction of phase shift between the tap-to-neutral primary voltage $V'_p$ and the output voltage $V'_s$ at the adjacent delta terminal is the same as the angle $\beta$ and the direction of phase shift between the primary line-to-neutral voltage $V_p$ and the secondary line-to-neutral voltage $V_s$ in the power transformer 10. In this manner a phase shift in the measuring circuit vectorially equal to that in the power transformer has the effect of reproducing in the output of the instrument rectifier the DC wave shape in the power rectifier.

At FIGS. 7 and 8 we have illustrated several embodiments of current autotransformers suitable for use with our invention. In each case there is illustrated a single magnetizable ring core upon which is wound one phase of the autotransformer winding with the winding sections on opposite sides of the tap having a 2:1 turns ratio, as for with a power transformer having a 30° line current phase shift. At FIG. 7 the autotransformer phase winding extends between its ends of the full 360° of the ring core, the terminal ends of the winding being designated by "S" for start and "E" for end and the input tap being designated at "T". At FIG. 8 we have illustrated schematically a preferred form of autotransformer phase winding in which the winding section from the S to T extends for the full 360° of the ring core and the second winding section from the T to the E is rewound over the same full 360° of the core.

Figure 9:
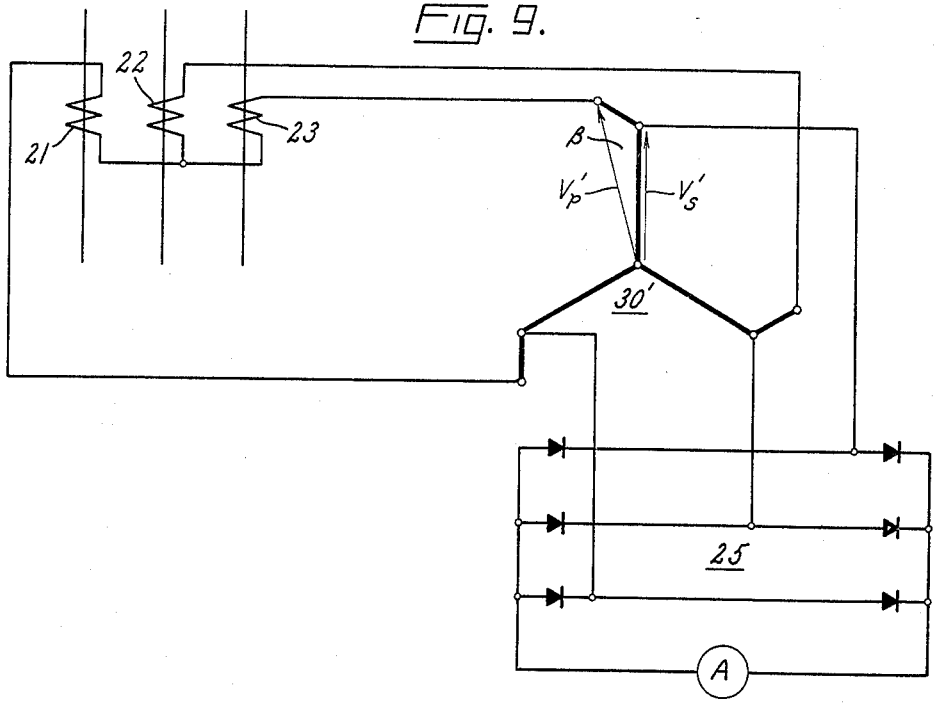
FIGS. 9 and 10 are schematic circuit diagrams of wye-connected phase shifting transformers suitable for use with our invention.

In the embodiments of our invention described above we have illustrated the phase shifting transformer in our current measuring circuit as a delta-connected current autotransformer. While we prefer for efficiency in the use of materials to use an autotransformer, it is not essential that it be delta connected. If desired a wye-connected phase shifting transformer may be used, as by utilizing a zig-zag connection of the primary or secondary windings. At FIG. 9, for example, we have illustrated schematically a wye-connected zig-zag autotransformer 30' having primary terminals connected to the line current transformers 21, 22, 23 as at FIG. 6 and secondary terminals connected to a three phase instrument rectifier 25. As at FIG. 6 the phase angle β between primary and secondary voltages in the transformer 30' is equal to the phase angle β between primary and secondary voltages in the power transformer. If desired the primary and secondary winding terminals shown at FIG. 9 may be interchanged.

Figure 10:
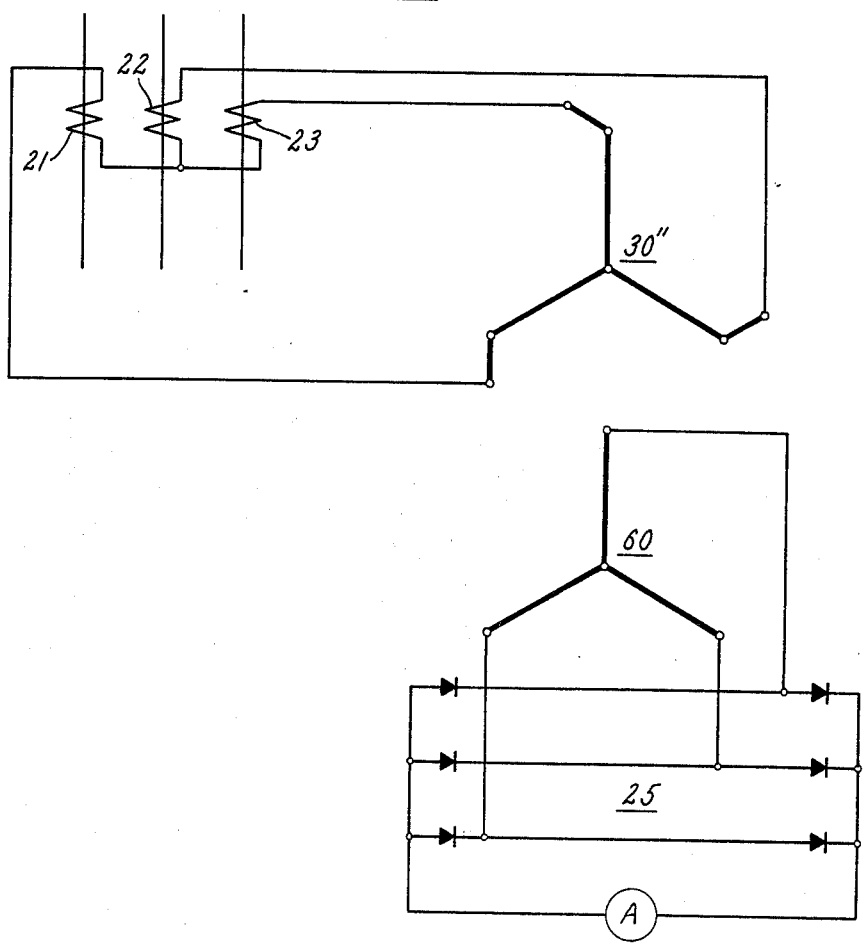

It will be evident to those skilled in the art that phase shifting transformers having electrically isolated primary and secondary windings may be utilized with our invention. For example, the wye connected phase shifting transformer of FIG. 9 may, if desired, be provided with an electrically isolated wye connected secondary winding 60, as illustrated at FIG. 10. If desired, also, the primary and secondary windings of the transformer shown at FIG. 10 may be interchanged, i.e., the zig-zag windings may be provided in the secondary rather than the primary. In like manner, a delta-connected phase shifting transformer as shown at FIGS. 3 and 6 may be provided with isolated secondary windings.

It may now be noted that the foregoing Dortort patent teaches that where the power transformer phase shift is 30° it may be counteracted in the measuring circuit by delta connection of the line current transformers, thereby reproducing such 30° phase shift in the measuring circuit. It will be evident that such a delta connection of line current transformers may also be used in practicing our invention, as with a power transformer having other, and usually less, than 30° phase shift. In such a case it is only necessary to so adjust our phase shifting transformer that the difference between power transformer phase shift and line current transformer phase shift is effected by the phase shifting transformer.

Thus, while we have described certain preferred embodiments of our invention by ways of illustration, many modifications will occur to those skilled in the art, and we therefore wish to have it understood that we intend in the appended claims to cover all such modifications as fall within the true spirit and scope of the invention.

What we claim as new and desire to secure by Letters Patent of the United States is:

1. In a system for measuring the magnitude of direct output current from a multiphase power rectifier having an input circuit including a multiphase power transformer, said power transformer having primary and secondary phase windings connected to provide a phase shift between the multiphase primary and secondary line currents coupled by said power transformer, the combination which comprises line current transformers for measuring each said primary line currents, said line current transformers having secondary windings each connected at one end to a common neutral terminal, a phase shifting current transformer comprising primary and secondary phase windings coupled by separate magnetizable cores in each phase, said cores being designed for normal operation below saturation, means connecting said line current transformer secondary windings to the primary windings of said phase shifting current transformer, said phase shifting transformer providing a primary to secondary winding current phase shift vectorially equal to the current phase shift in said power transformer, a multiphase instrument rectifier connected to the secondary windings of said phase shifting current transformer, and a direct current measuring instrument connected to the output terminals of said instrument rectifier.

2. A measuring system according to claim 1 wherein said phase shifting transformer is provided with electrically isolated primary and secondary windings.

3. In a system for measuring the magnitude of direct output current from a multiphase power rectifier having an input circuit including a multiphase power transformer, said power transformer having primary and secondary phase windings connected to provide a phase shift between the multiphase primary and secondary line currents coupled by said power transformer, the combination which comprises line current transformers for measuring said primary line currents, said current transformers having secondary windings each connected at one end to a common neutral terminal, a current autotransformer comprising primary and secondary phase windings one of which is defined in each phase by an intermediate tap terminal on the other, said primary and secondary phase windings of said autotransformer being coupled by separate magnetizable cores in each phase and said cores being designed for normal operation below saturation, means connecting said line current transformer secondary windings to the primary windings of said current autotransformer, said tap terminals being positioned to provide a primary to secondary winding current phase shift in said autotransformer vectorially equal to current phase shift in said power transformer, a multiphase instrument rectifier connected to the secondary windings of said autotransformer, and a direct current measuring instrument connected to the output terminals of said instrument rectifier.

4. A measuring system according to claim 3 wherein said current autotransformer secondary windings are connected in series circuit relation and said tap terminals define primary winding portions in each phase.

5. A measuring system according to claim 3 wherein said current autotransformer windings are connected to a common neutral terminal and said tap terminals connect zig-zag related portions of each phase winding.

6. A measuring system according to claim 4 wherein said autotransformer tap terminals are so positioned that the output currents of said autotransformer have the same wave shapes as the output currents of said power transformer.

7. A measuring system according to claim 3 for a three phase power rectifier wherein said line current transformers are wye connected and said current autotransformer is delta connected.

8. A measuring system according to claim 1 for a three phase power rectifier characterized by a 30° current phase shift wherein said line current transformers are wye connected, said phase shifting transformer is an autotransformer and said tap terminals are positioned to divide said autotransformer phase windings symmetrically into sections having a 1:2 ratio in each phase winding.

9. A measuring system according to claim 1 for a three phase power rectifier wherein said line current transformers are wye connected and said phase shifting transformer includes electrically isolated primary and secondary winding groups each connected in wye-circuit relation, one said group of wye-connected winding including zig-zag related phase winding portions.

10. A measuring system according to claim 1 for a three phase power rectifier of the three phase bridge type wherein said instrument rectifier is of the three phase bridge type.

11. A measuring system according to claim 1 for a three phase power rectifier wherein said instrument rectifier comprises three single phase full wave rectifiers having output terminals connected in series circuit relation, and three phase transformer means coupling the input terminals of said single phase full wave rectifiers respectively to the output terminals of said phase shifting current transformer, said transformer means comprising three current transformers having their primary windings connected in wye circuit relation.

12. In a system for measuring the magnitude of direct output current from a multiphase power rectifier having an input circuit including a multiphase power transformer, said power transformer having primary and secondary phase windings connected to provide a phase shift between the multiphase primary and secondary line currents coupled by said power transformer, the combination which comprises line current transformers for measuring each said primary line currents, a phase shifting current transformer comprising primary and secondary phase windings coupled by separate magnetizable cores in each phase, said cores being designed for normal operation below saturation, means connecting said line current transformer secondary windings to the primary windings of said phase shifting current transformer, said phase shifting transformer providing a differential primary to secondary winding current phase shift vectorially equal to the difference between current phase shift in said power transformer and said line current transformers, a multiphase instrument rectifier connected to the secondary windings of said phase shifting current transformer, and a direct current measuring instrument connected to the output terminals of said instrument rectifier.

13. A measuring system according to claim 12 wherein said phase shifting transformer is an autotransformer having phase winding tap terminal positioned to produce said differential phase shift.

* * * * *